(12) United States Patent
Lu et al.

(10) Patent No.: US 10,991,793 B2
(45) Date of Patent: Apr. 27, 2021

(54) DOUBLE-SIDED CAPACITOR AND METHOD FOR FABRICATING THE SAME

(71) Applicant: SHENZHEN WEITONGBO TECHNOLOGY CO., LTD., Shenzhen (CN)

(72) Inventors: Bin Lu, Shenzhen (CN); Jian Shen, Shenzhen (CN)

(73) Assignee: SHENZHEN WEITONGBO TECHNOLOGY CO., LTD., Shenzhen (CN)

(*) Notice: Subject to any disclaimer, the term of this patent is extended or adjusted under 35 U.S.C. 154(b) by 15 days.

(21) Appl. No.: 16/659,574

(22) Filed: Oct. 22, 2019

(65) Prior Publication Data

US 2020/0058732 A1 Feb. 20, 2020

Related U.S. Application Data

(63) Continuation of application No. PCT/CN2018/099402, filed on Aug. 8, 2018.

(51) Int. Cl.
*H01L 49/02* (2006.01)
*H01L 29/94* (2006.01)
*H01L 27/08* (2006.01)
*H01L 27/06* (2006.01)
*H01L 27/12* (2006.01)

(52) U.S. Cl.
CPC .......... *H01L 28/92* (2013.01); *H01L 27/0694* (2013.01); *H01L 27/0805* (2013.01); *H01L 27/1203* (2013.01); *H01L 29/945* (2013.01)

(58) Field of Classification Search
CPC . H01L 27/0805; H01L 27/0694; H01L 28/40; H01L 29/66181; H01L 29/945
See application file for complete search history.

(56) References Cited

U.S. PATENT DOCUMENTS

| | | | |
|---|---|---|---|
| 5,447,878 A | 9/1995 | Park et al. | |
| 5,583,359 A | 12/1996 | Ng et al. | |
| 9,330,952 B2 | 5/2016 | Moslehi et al. | |
| 9,997,389 B2 | 6/2018 | Moslehi et al. | |

(Continued)

FOREIGN PATENT DOCUMENTS

| | | |
|---|---|---|
| CN | 1809919 A | 7/2006 |
| CN | 102782827 A | 11/2012 |

(Continued)

*Primary Examiner* — David C Spalla
(74) *Attorney, Agent, or Firm* — Scully Scott Murphy & Presser

(57) ABSTRACT

A method for fabricating a double-sided capacitor is disclosed, which includes: etching trenches having depths not reaching an intermediate insulating layer and trench structures having depths exceeding the intermediate insulating layer on both sides of a silicon-on-insulator (SOI) substrate; and sequentially depositing an insulating dielectric film and a conductive material on surfaces of the trenches and the trenches, then removing insulating material at a bottom of the trenches and the trenches are filled with the conductive material to form conductive channels. The upper conductive channel of the SOI substrate is insulated from an upper layer and is electrically connected to a lower layer; and the lower conductive channel is insulated from the lower layer and is electrically connected to the upper layer.

15 Claims, 6 Drawing Sheets

(56) References Cited

U.S. PATENT DOCUMENTS

| | | | |
|---|---|---|---|
| 10,411,087 B2* | 9/2019 | Nishiyama | H01G 4/06 |
| 2001/0015429 A1 | 8/2001 | Leonardi et al. | |
| 2010/0181645 A1* | 7/2010 | Marenco | H01L 27/0805 |
| | | | 257/532 |
| 2013/0141833 A1* | 6/2013 | Moslehi | H02N 13/00 |
| | | | 361/234 |
| 2014/0374879 A1* | 12/2014 | Chen | H01L 21/302 |
| | | | 257/532 |
| 2015/0108606 A1* | 4/2015 | Lamy | H01L 23/481 |
| | | | 257/532 |
| 2015/0145104 A1* | 5/2015 | Bauer | H01L 27/0682 |
| | | | 257/534 |
| 2016/0190230 A1* | 6/2016 | Krach | H01L 29/66181 |
| | | | 257/532 |
| 2016/0358802 A1 | 12/2016 | Moslehi et al. | |
| 2017/0352618 A1* | 12/2017 | Fitzsimmons | H01L 28/40 |
| 2018/0122580 A1 | 5/2018 | Park et al. | |

FOREIGN PATENT DOCUMENTS

| | | |
|---|---|---|
| CN | 101946304 B | 6/2013 |
| CN | 102376780 B | 9/2013 |
| EP | 0813752 A1 | 12/1997 |
| JP | 2012248604 A | 12/2012 |

\* cited by examiner

DOUBLE-SIDED CAPACITOR AND METHOD FOR FABRICATING THE SAME

CROSS-REFERENCE TO RELATED DISCLOSURES

The present disclosure is a continuation of international disclosure No. PCT/CN2018/099402, filed on Aug. 8, 2018, which is hereby incorporated by reference in its entirety.

TECHNICAL FIELD

The present disclosure relates to the field of capacitors, and in particular, to a double-sided capacitor and a method for fabricating the same.

BACKGROUND

In recent years, as an IC module in various types of electronic devices has been increasingly integrated and has continuously developed towards multifunction, high frequency, low power consumption and miniaturization, an electromagnetic environment in a circuit has become more and more complicated. To ensure a normal operation of the circuit, a passive component (a capacitor, an inductor, or the like) is required to filter electromagnetic noise and stabilize a working voltage. Under this background, there is a huge demand for capacitors with small size, high capacity, high precision and high reliability in the market.

A multi-layer ceramic capacitor (MLCC) is a mainstream patch capacitor product in the current market. However, due to its technical characteristics, costs of fabricating an ultra-micro and ultra-thin MLCC are extremely high and only a few companies masters the fabricating technology.

Since the 1990s, a 3D silicon-based capacitor based on a semiconductor wafer processing technology has attracted extensive research interest. Fabricating such capacitor requires first etching a 3D structure on a high-resistivity silicon substrate to increase a surface area, and then sequentially fabricating a lower electrode, a dielectric layer and an upper electrode of the capacitor on a surface of the 3D structure.

There are several directions to increase a capacitance density of the 3D silicon-based capacitor as follows: first, an etching process is improved, the surface area is further increased by fabricating a 3D structure with a higher aspect ratio, however, process difficulty of depositing a conductive material and a dielectric material in a structure with a higher aspect ratio is correspondingly increased; second, a dielectric thickness is reduced or a high-k dielectric material is used, however, the former is not conducive to controlling the leakage current of the device, and the latter is still in a research stage and a related process is not yet mature; and third, two or more capacitors are fabricated in a deep hole or trench by stacking multiple layers of dielectric and conductive materials using an existing mature material and process system, and finally a plurality of capacitors in the longitudinal direction are connected in parallel through electrode interconnection so as to achieve a purpose of multiplying the capacitance density. However, fabricating a multilayer capacitor has numerous steps and a complex process flow, and is costly.

SUMMARY

The present disclosure provides a double-sided capacitor and a method for fabricating the same, which avoids etching a trench penetrating through a substrate so that an entire structure has stronger mechanical strength, and increases a capacitance by utilizing a substrate capacitance of an SOI (Silicon-On-Insulator) substrate itself.

According to a first aspect, a double-sided capacitor is provided, including a first semiconductor layer (101), an intermediate insulating layer (120), a second semiconductor layer (102), a first insulating layer (109), a second insulating layer (110), a first electrode layer (113), and a second electrode layer (114).

Specifically, the intermediate insulating layer (120) is disposed between the first semiconductor layer (101) and the second semiconductor layer (102); and the first semiconductor layer (101) is provided with a first trench (105) and a second trench (107), where the first trench (105) and the second trench (107) are downward from an upper surface of the first semiconductor layer (101), a depth of the first trench (105) is less than a thickness of the first semiconductor layer (101), and the second trench (107) penetrates through the first semiconductor layer (101) and the intermediate insulating layer (120).

The second semiconductor layer (102) is provided with a third trench (106) and a fourth trench (108), where the third trench (106) and the fourth trench (108) are upward from a lower surface of the second semiconductor layer (102), a depth of the third trench (106) is less than a thickness of the second semiconductor layer (102), the fourth trench (108) penetrates through the second semiconductor layer (102) and the intermediate insulating layer (120), and any two of the first trench (105), the second trench (107), the third trench (106), and the fourth trench (108) are not communicated.

The first electrode layer (113) is disposed above the first semiconductor layer (101), in the first trench (105), and in the second trench (107); and the first insulating layer (109) is disposed between the first electrode layer (113) and the first semiconductor layer (101) to isolate the first electrode layer (113) in the first trench (105) from the first semiconductor layer (101), and broken at a bottom of the second trench (107) to electrically connect the first electrode layer (113) to the second semiconductor layer (102).

The second electrode layer (114) is disposed below the second semiconductor layer (102), in the third trench (106), and in the fourth trench (108); and the second insulating layer (110) is disposed between the second electrode layer (114) and the second semiconductor layer (102) to isolate the second electrode layer (114) in the third trench (106) from the second semiconductor layer (102), and broken at a bottom of the fourth trench (108) to electrically connect the second electrode layer (114) to the first semiconductor layer (101).

With reference to the first aspect, in a first implementation manner of the first aspect, a width of any cross section of the first trench (105) in the first semiconductor layer (101) is less than that of the second trench (107); and/or a width of any cross section of the third trench (106) in the second semiconductor layer (102) is less than that of the fourth trench (108).

With reference to the first aspect and the foregoing implementation manners, in another implementation manner of the first aspect, the capacitor further includes: a first passivation insulating layer (103) disposed between the first semiconductor layer (101) and the first insulating layer (109), the first trench (105) and the second trench (107) penetrating through the first passivation insulating layer (103); and/or a second passivation insulating layer (104) disposed between the second semiconductor layer (102) and the second insulating layer (110), the third trench (106) and the fourth trench (108) penetrating through the second passivation insulating layer (104).

With reference to the first aspect and the foregoing implementation manners, in another implementation manner of the first aspect, materials of the first passivation insulating layer (103) and/or the second passivation insulating layer (104) are at least one of a silicon oxide, a silicon nitride and a polymer.

With reference to the first aspect and the foregoing implementation manners, in another implementation manner of the first aspect, a shape of a cross section of the first trench (105) is different from a shape of a cross section of the second trench (107), and/or a shape of a cross section of the third trench (106) is different from a shape of a cross section of the fourth trench (108).

With reference to the first aspect and the foregoing implementation manners, in another implementation manner of the first aspect, the first insulating layer (109) and/or the second insulating layer (110) include at least one of a silicon oxide layer, a silicon nitride layer, a metal oxide layer, and a metal nitride layer.

With reference to the first aspect and the foregoing implementation manners, in another implementation manner of the first aspect, the first electrode layer and/or the second electrode layer include at least one layer of heavily doped polysilicon, a carbon-based material, metal and titanium nitride.

According to a second aspect, a method for fabricating a double-sided capacitor is provided, and the method includes: providing an SOI substrate, where the SOI substrate includes a first semiconductor layer, an intermediate insulating layer and a second semiconductor layer from top to bottom; and etching the first semiconductor layer to form a first trench and a second trench, where the first trench and the second trench are downward from an upper surface of the first semiconductor layer, a depth of the first trench is less than a thickness of the first semiconductor layer, and the second trench penetrates through the first semiconductor layer and the intermediate insulating layer.

The method also includes: etching the second semiconductor layer to form a third trench and a fourth trench, where the third trench and the fourth trench are upward from a lower surface of the second semiconductor layer, a depth of the third trench is less than a thickness of the second semiconductor layer, the fourth trench penetrates through the second semiconductor layer and the intermediate insulating layer, and any two of the first trench, the second trench, the third trench and the fourth trench are not communicated.

The method also includes: depositing an insulating material above the first semiconductor layer, on an inner surface of the first trench and on an inner surface of the second trench, and removing the insulating material at a bottom of the second trench such that the insulating material is broken at the bottom of the second trench to expose the second semiconductor layer.

The method also includes: depositing an insulating material below the second semiconductor layer, on an inner surface of the third trench and on an inner surface of the fourth trench, and removing the insulating material at a bottom of the fourth trench such that the insulating material is broken at the bottom of the fourth trench to expose the first semiconductor layer.

The method also includes: depositing a conductive material above the first semiconductor layer, in the first trench and in the second trench where the insulating material is deposited, to form a first electrode layer; and depositing a conductive material below the second semiconductor layer, in the third trench and in the fourth trench where the insulating material is deposited, to form a second electrode layer.

With reference to the second aspect and the foregoing implementation manners, in another implementation manner of the second aspect, the etching the first semiconductor layer of the SOI substrate to form the first trench and the second trench includes: growing a first passivation insulating layer on the upper surface of the first semiconductor layer, and etching the first passivation insulating layer and the first semiconductor layer to form the first trench and the second trench, where the first trench and the second trench penetrate through the first passivation insulating layer.

With reference to the second aspect and the foregoing implementation manners, in another implementation manner of the second aspect, the etching the second semiconductor layer to form the third trench and the fourth trench includes: growing a second passivation insulating layer on the lower surface of the second semiconductor layer, and etching the second passivation insulating layer and the second semiconductor layer to form the third trench and the fourth trench, where the third trench and the fourth trench penetrate through the second passivation insulating layer.

With reference to the second aspect and the foregoing implementation manners, in another implementation manner of the second aspect, the etching the first passivation insulating layer and the first semiconductor layer includes: spin-coating a first photoresist layer on an upper surface of the first passivation insulating layer, partially opening at least two first windows on the first photoresist layer, etching the first passivation insulating layer and the first semiconductor layer along the at least two first windows to form the first trench and the second trench, and removing the first photoresist layer after the etching.

With reference to the second aspect and the foregoing implementation manners, in another implementation manner of the second aspect, the growing the second passivation insulating layer on the lower surface of the second semiconductor layer includes: spin-coating a second photoresist layer on an upper surface of the second passivation insulating layer, partially opening at least two second windows on the second photoresist layer, etching the second passivation insulating layer and the second semiconductor layer along the at least two second windows to form the third trench and the fourth trench, and removing the second photoresist layer after the etching.

With reference to the second aspect and the foregoing implementation manners, in another implementation manner of the second aspect, the growing the first passivation insulating layer and/or the second passivation insulating layer includes at least one of the following: growing a silicon dioxide layer by thermal oxidation, where the first passivation insulating layer and/or the second passivation insulating layer include the silicon dioxide layer; growing a silicon nitride layer or a silicon oxide layer by physical vapor deposition and/or chemical vapor deposition, where the first passivation insulating layer and/or the second passivation insulating layer include the silicon nitride layer and/or the silicon oxide layer; spraying and/or spin-coating a polymer layer or a spin on glass, where the first passivation insulating layer and/or the second passivation insulating layer include the polymer layer or the spin on glass.

With reference to the second aspect and the foregoing implementation manner, in another implementation manner of the second aspect, the etching is deep reactive ion etching.

With reference to the second aspect and the foregoing implementation manner, in another implementation manner of the second aspect, the depositing the insulating material includes at least one of the following: growing silicon dioxide by thermal oxidation, where the insulating material includes the silicon dioxide; depositing the insulating material by at least one of physical vapor deposition, chemical vapor deposition, atomic layer deposition, spraying and spin-coating.

With reference to the second aspect and the foregoing implementation manner, in another implementation manner of the second aspect, the depositing the conductive material includes: depositing the conductive material by at least one of atomic layer deposition, physical vapor deposition, metal-organic chemical vapor deposition, vapor deposition, and electroplating.

Therefore, according to a double-sided capacitor and a method for fabricating the same of an embodiment of the present disclosure, a trench structure having a depth not reaching an intermediate insulating layer and a trench structure having a depth exceeding the intermediate insulating layer are etched on both sides of an SOI substrate; an insulating dielectric film and a conductive material are sequentially deposited on a surface of the trench having the depth not reaching the intermediate insulating layer to form a capacitor; after an insulating dielectric film is deposited on a surface of the trench having the depth exceeding the intermediate insulating layer and the dielectric material at the bottom is removed, a conductive material is filled in the trench structure having the depth exceeding the intermediate insulating layer to become a conductive channel. At least one channel is insulated from an upper layer of the SOI substrate and is electrically connected to a lower layer of the SOI substrate; and at least one channel is insulated from the lower layer of the SOI substrate and is electrically connected to the upper layer of the SOI substrate. In this way, not only could etching a trench penetrating through a substrate be avoided so that an entire structure has stronger mechanical strength, but also a capacitance is larger utilizing a substrate capacitance of an SOI wafer itself.

DESCRIPTION OF EMBODIMENTS

The technical solutions in embodiments of the present disclosure will be described hereinafter in conjunction with the accompanying drawings.

Figure 1:
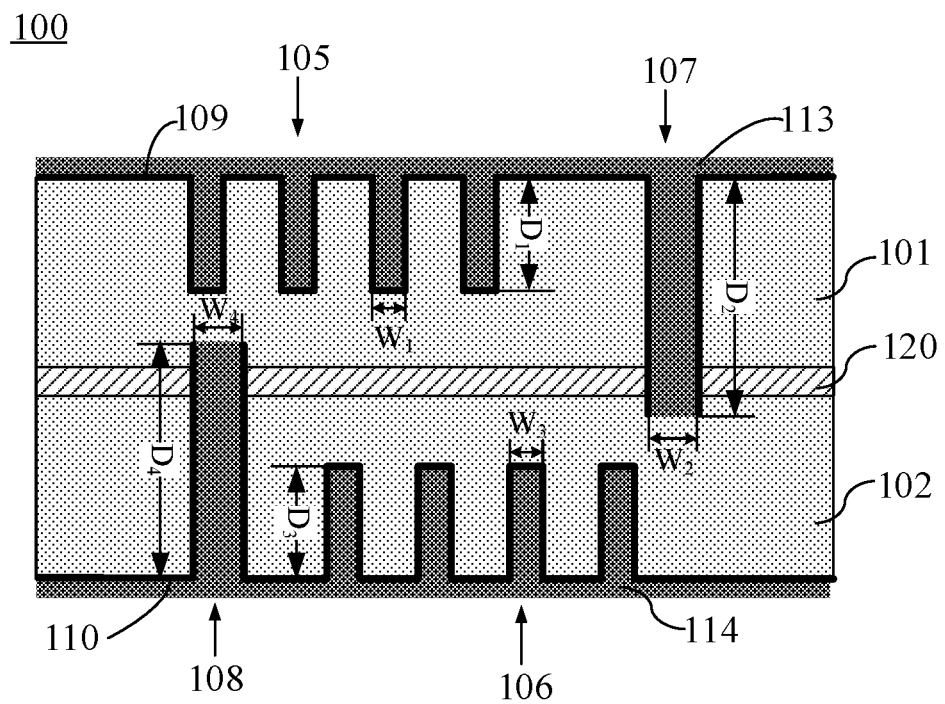
FIG. 1 is a schematic diagram of a double-sided capacitor according to an embodiment of the present disclosure.

FIG. 1 shows a schematic diagram of a double-sided capacitor 100 according to an embodiment of the present disclosure, that is, a schematic diagram of a longitudinal section of the double-sided capacitor 100. As shown in FIG. 1, the double-sided capacitor 100 includes a first semiconductor layer 101, an intermediate insulating layer 120, a first insulating layer 109, a second insulating layer 110, a second semiconductor layer 102, a first electrode layer 113, and a second electrode layer 114, where the intermediate insulating layer 120 is disposed between the first semiconductor layer 101 and the second semiconductor layer 102.

Specifically, the first semiconductor layer 101 is provided with at least one first trench 105 and at least one second trench 107, and in this example, four first trenches 105 and one second trench 107 are taken as example as shown in FIG. 1. The first trench 105 and the second trench 107 extend downward from an upper surface of the first semiconductor layer 101, a depth of the first trench 105 is less than a thickness of the first semiconductor layer 101, that is, the first trench 105 does not penetrate through the first semiconductor layer 101, and the second trench 107 penetrates through the first semiconductor layer 101 and the intermediate insulating layer 120.

The second semiconductor layer 102 is provided with at least one third trench 106 and at least one fourth trench 108, the third trench 106 and the fourth trench 108 extend upward from a lower surface of the second semiconductor layer 102, a depth of the third trench 106 is less than a thickness of the second semiconductor layer 102, that is, the third trench 106 does not penetrate through the second semiconductor layer 102, the fourth trench 108 penetrates through the second semiconductor layer 102 and the intermediate insulating layer 120, and any two of the at least one first trench 105, the at least one second trench 107, the at least one third trench 106, and the at least one fourth trench 108 are not communicated.

The first electrode layer 113 is disposed above the first semiconductor layer 101, in the at least one first trench 105, and in the at least one second trench 107; and the first insulating layer 109 is disposed between the first electrode layer 113 and the first semiconductor layer 101, the first electrode layer 113 is electrically isolated from the first semiconductor layer 101 through the first insulating layer 109, and electrically connected to the second semiconductor layer 102 through a bottom of the at least one second trench 107.

The second electrode layer 114 is disposed below the second semiconductor layer 102, in the at least one third trench 106, and in the at least one fourth trench 108; and the second insulating layer 110 is disposed between the second electrode layer 114 and the second semiconductor layer 102, the second electrode layer 114 is electrically isolated from the second semiconductor layer 102 through the second insulating layer 110, and electrically connected to the first semiconductor layer 101 through a bottom of the at least one fourth trench 108.

The first electrode layer 113 and the second electrode layer 114 are used as two electrodes of the double-sided capacitor, respectively.

It should be understood that in the embodiment of the present disclosure, sizes of cross sections of the first trench 105, the second trench 107, the third trench 106, and the fourth trench 108 are not limited. For example, the trench may be a hole with a small difference in length and width of a cross section, or a trench with a large difference in length and width.

Optionally, in the embodiment of the present disclosure, a depth $D_1$ of the first trench 105 is less than a depth $D_2$ of the second trench 107, and a depth $D_3$ of the third trench 106 is less than a depth $D_4$ of the fourth trench 108. Correspondingly, in view of a processing technology, generally the deeper a depth and the greater a width or an opening size, and thus a width $W_1$ of the first trench 105 may be less than a width $W_2$ of the second trench 107 and a width $W_3$ of the third trench 106 may be less than a width $W_4$ of the fourth trench 108. The width may also be referred to as the opening size, or is also equivalent to a maximum spacing of an inner wall of the trench, that is, an opening size of the first trench 105 is less than an opening size of the second trench 107, and an opening size of the third trench 106 can be less than an opening size of the fourth trench 108; in other words, a maximum spacing of an inner wall of the first trench 105 is less than a maximum spacing of an inner wall of the second trench 107, and a maximum spacing of an inner wall of the third trench 106 may be less than a maximum spacing of an inner wall of the fourth trench 108. Specifically, on any cross section of the first semiconductor layer 101, a width of a shape of the first trench 105 is less than a width of the second trench 107; on any cross section of the second semiconductor layer 102, a width of the third trench 106 is less than a width of the fourth trench 108, the width here is the opening size of the trench, and the width may refer to a width value at a maximum width of the trench.

In the embodiment of the present disclosure, the first semiconductor layer 101 may include the plurality of first trenches 105 whose shapes of cross sections may be the same or different; similarly, the first semiconductor layer 101 may include the plurality of second trenches 107 whose shapes of cross sections may be the same or different; correspondingly, shapes of cross sections of the plurality of third trenches 106 included in the second semiconductor layer 102 may be the same or different, and shapes of cross sections of the plurality of fourth trenches 108 may be the same or different.

Figure 7:
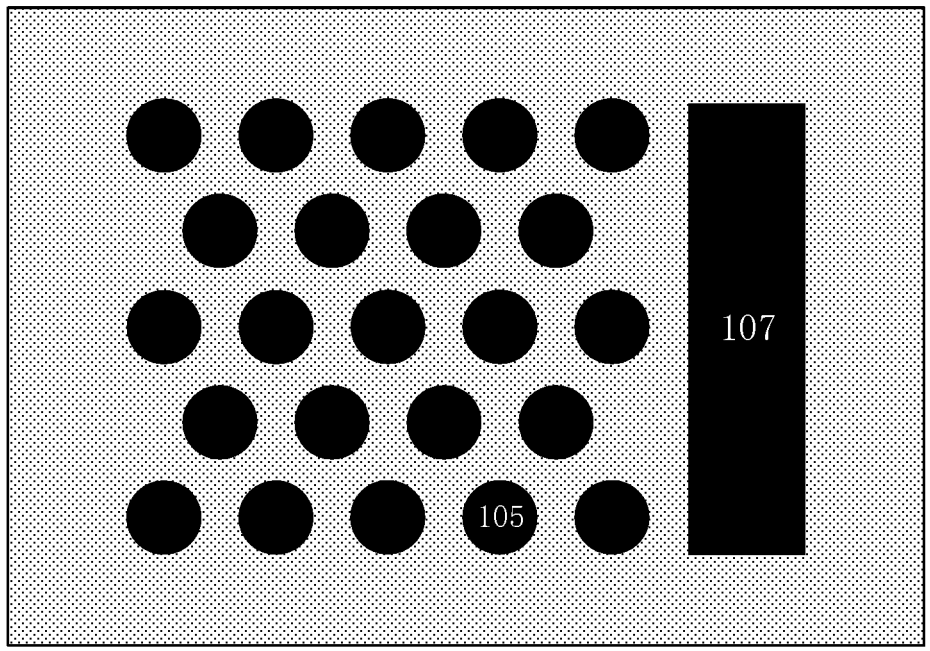
FIG. 7 is a schematic diagram of shapes of cross section of trenches of a capacitor according to an embodiment of the present disclosure.

In addition, a shape of a cross section of the first trench 105 and a shape of a cross section of the second trench 107 may the same or different. For example, a cross section of the first trench 105 is circular, that is, the first trench 105 is a circular hole, and a cross section of the second trench 107 is rectangular, that is, the second trench 107 is a square hole, as shown in FIG. 7; alternatively, a cross section of the first trench 105 and a cross section of the second trench 107 are both circular, and both of them are circular holes. Similarly, a shape of a cross section of the third trench 106 and a shape of a cross section of the fourth trench 108 may be the same or different. Furthermore, shapes of cross sections of the first trench 105, the second trench 107, the third trench 106, and the fourth trench 108 may be different from each other or may be the same.

Figure 2:
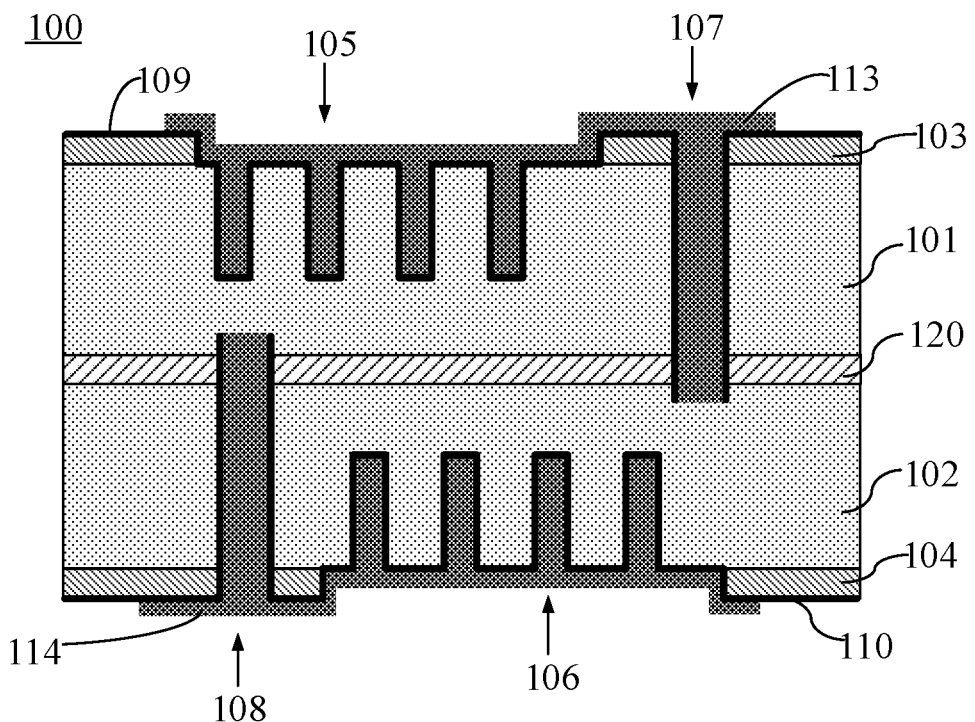
FIG. 2 is a schematic diagram of a double-sided capacitor according to another embodiment of the present disclosure.

Optionally, as shown in FIG. 2, a double-sided capacitor 100 may further include a first passivation insulating layer 103 disposed between a first semiconductor layer 101 and a first insulating layer 109; at least one first trench 105 and at least one second trench 107 extend through the first passivation insulating layer 103, and the first passivation insulating layer 103 may be configured to electrically isolate the first electrode layer 113 from the first semiconductor layer 101.

Optionally, as shown in FIG. 2, the double-sided capacitor 100 may further include a second passivation insulating layer 104 disposed between a second semiconductor layer 102 and a second insulating layer 110; at least one third trench 106 and at least one fourth trench 108 penetrate through the second passivation insulating layer 104, and the second passivation insulating layer 104 may be configured to electrically isolate the second electrode layer 114 from the second semiconductor layer 102.

Optionally, considering that when the at least one first trench 105 is a plurality of densely arranged trenches, the first passivation insulating layer 103 may be disposed on the first semiconductor layer 101 having a larger area, such as left and right regions of the first semiconductor layer 101 shown in FIG. 2; in other words, if a region where the first trench is located is regarded as an integral region, for example, being regard as a first trench region, an opening is formed on the formed first passivation insulating layer corresponding to the first trench region, that is, there is no first passivation insulating layer above the first trench region; similarly, when the at least one third trench 106 is a plurality of densely arranged trenches, the second passivation insulating layer 104 may be disposed on the second semiconductor layer 102 having a larger area, such as left and right regions of the lower layer shown in FIG. 2, however the embodiment of the present disclosure is not limited thereto.

Figure 3:
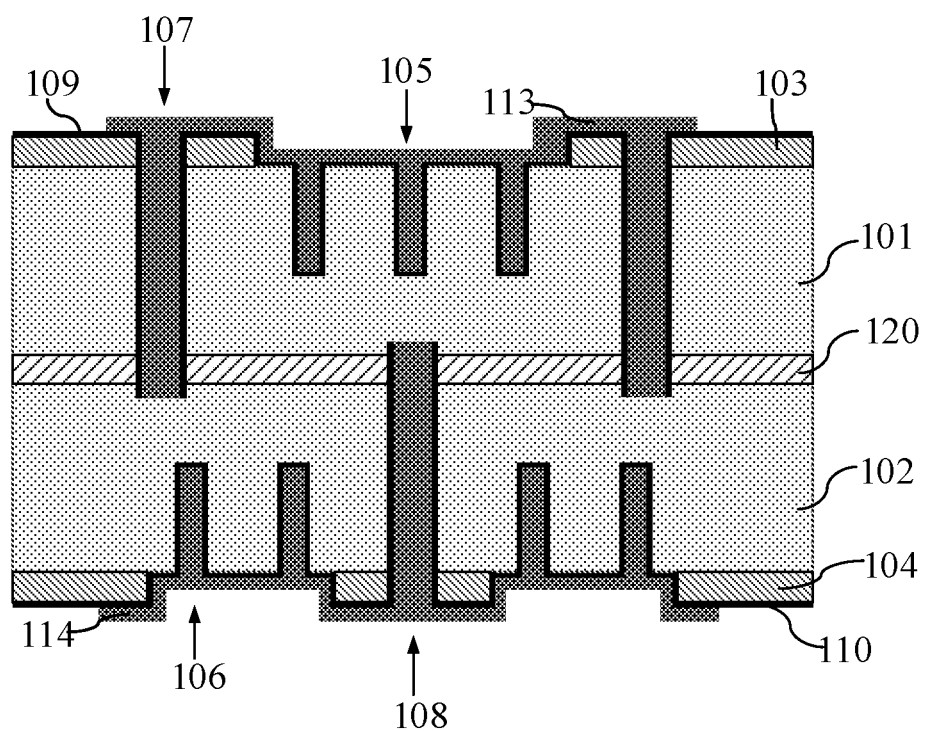
FIG. 3 is a schematic diagram of a double-sided capacitor according to yet another embodiment of the present disclosure.

Optionally, the upper layer and the lower layer of the double-sided capacitor 100 shown in FIGS. 1 and 2 are symmetrical, and the number of trenches included therein is also the same, where a symmetrical manner may be a central symmetry. On the contrary, as shown in FIG. 3, the upper layer and lower layer may also be asymmetric, and the number of trenches included therein may also be different, which is not limited in the embodiment of the present disclosure.

Next, a structure of a double-sided capacitor 100 will be described in detail with reference to a method for fabricating the double-sided capacitor 100 shown in FIG. 4.

Figure 4:
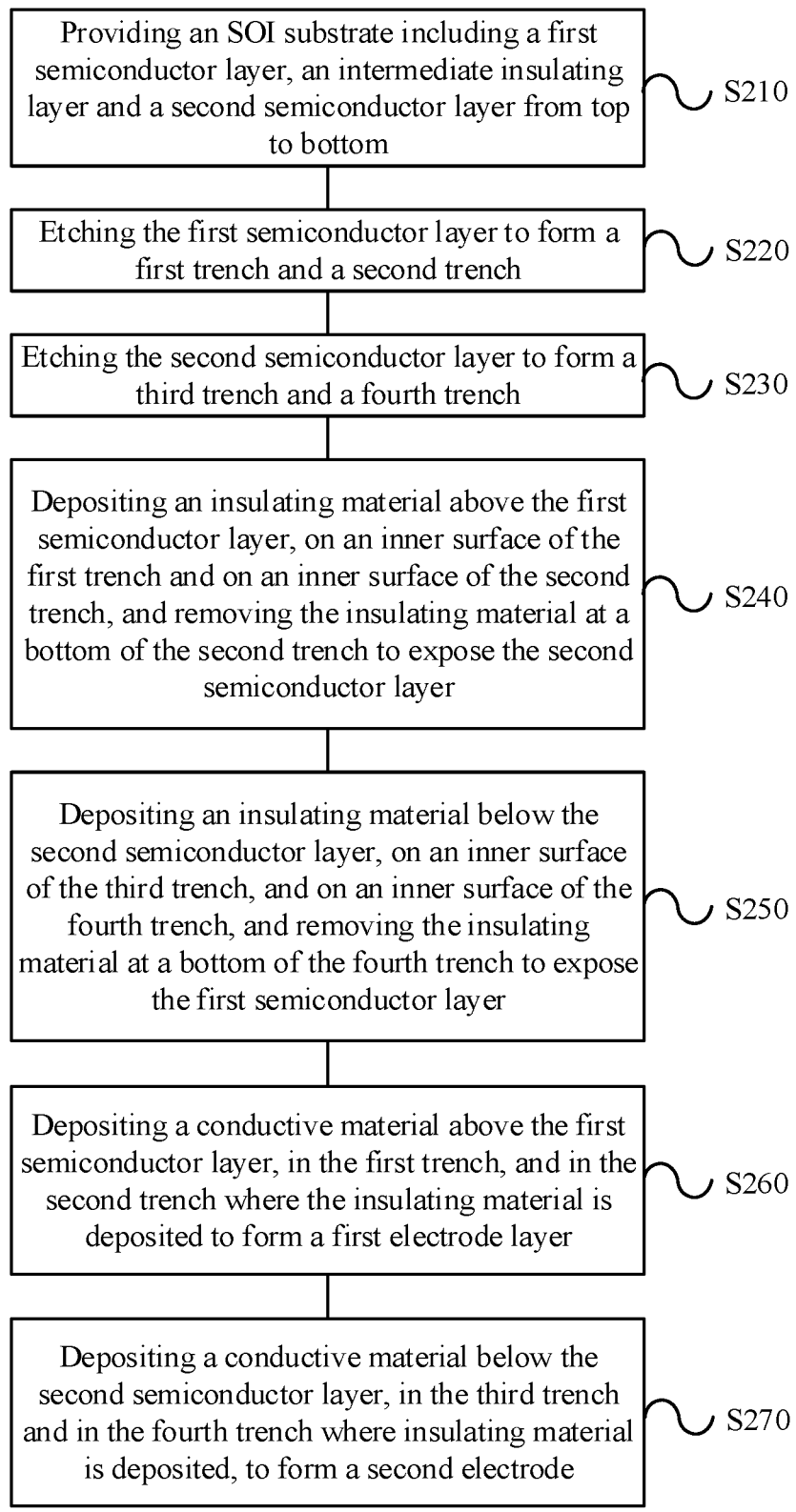
FIG. 4 is a schematic flowchart of a method for fabricating a double-sided capacitor according to an embodiment of the present disclosure.

FIG. 4 shows a schematic flowchart of a method 200 for fabricating a double-sided capacitor according to an embodiment of the present disclosure. As shown in FIG. 4, the method 200 includes: S210, providing an SOI substrate including a first semiconductor layer, an intermediate insulating layer and a second semiconductor layer from top to bottom; S220, etching the first semiconductor layer of the SOI substrate to form a first trench and a second trench; and S230, etching the second semiconductor layer to form a third trench and a fourth trench.

Figure 5:
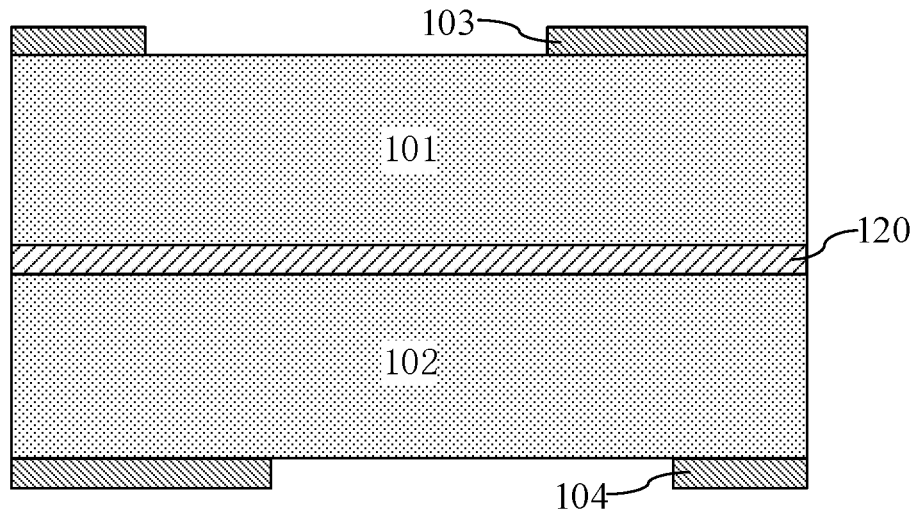
FIG. 5 is a schematic diagram of a process for fabricating a double-sided capacitor according to an embodiment of the present disclosure.

As shown in FIG. 5, an SOI substrate includes a first semiconductor layer 101, an intermediate insulating layer 120, and a second semiconductor layer 102, materials of the first semiconductor layer 101 and the second semiconductor layer 102 may be the same, for example, monocrystalline silicon, such as P-type monocrystalline silicon with resistivity about 1 mΩ•cm; and the intermediate insulating layer 120 is made of an insulating material, for example, silicon dioxide.

It should be understood that a thickness of each layer of the SOI substrate shown in FIG. 5 is only schematic and is independent of the actual thickness, for example, a thickness of the first semiconductor layer 101 may be 200 microns and a thickness of the intermediate insulating layer 120 may be 100 nanometers; alternatively, a thickness of the first semiconductor layer 101 is less than a thickness of the intermediate insulating layer 120; alternatively, a thickness of the first semiconductor layer 101 may be equal to a thickness of the second semiconductor layer 102, or may not be equal to a thickness of the second semiconductor layer 102, which is not limited in the embodiment of the present disclosure.

Figure 6:
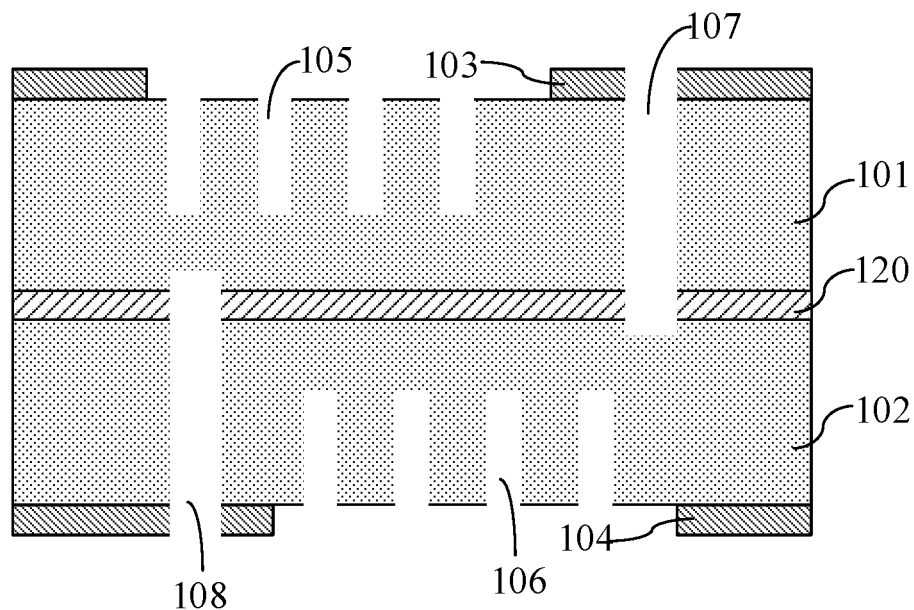
FIG. 6 is another schematic diagram of a process for fabricating a double-sided capacitor according to an embodiment of the present disclosure.

In the embodiment of the present disclosure, in conjunction with FIG. 5, before the etching the first semiconductor layer of the SOI substrate in S220, the method 200 may also include: growing a first passivation insulating layer on an upper surface of the first semiconductor layer; and similarly, before the etching the second semiconductor layer in S230, the method 200 may also include: growing a second passivation insulating layer on a lower surface of the second semiconductor layer. As shown in FIG. 6, the first passivation insulating layer 103 is grown on the upper surface of the first semiconductor layer 101, and the second passivation layer 104 is grown on the lower surface of the second semiconductor 102.

In the embodiment of the present disclosure, insulating passivation layers, such as the first passivation insulating layer 103 and the passivation insulating layer 104 are fabricated on the upper and lower surfaces of the SOI substrate; and the passivation insulating layer may be grown by at least one of the following manners, here, description is made by an example of growing the first passivation insulating layer 103, it is also applicable to the second passivation insulating layer 104, and the growing manner may be the same or different.

For example, silicon dioxide is grown on the upper surface of the first semiconductor layer 101 as the passivation insulating layer 103 by means of thermal oxidation. For another example, by means of physical vapor deposition (PVD) or chemical vapor deposition (CVD), a silicon nitride or a silicon oxide such as unpoded silicon glass (USG) or silicon dioxide converted by tetraethyl orthosilicate (TEOS) or the like is grown as the passivation insulating layer 103. For yet another example, various sprayed or spin-coated polymers such as polyimide, parylene, benzocyclobutene (BCB) and the like are used as the passivation insulating layer 103; alternatively, the passivation insulating layer may also be a spin on glass (SOG), that is, amorphous phase silicon oxide obtained by spin-coating or spraying a silicide-containing solution on a silicon wafer, then performing heating to remove a solvent, and conducting curing. In view of processing effect and costs, it is generally selected that silicon dioxide is grown as the passivation insulating layers 103 and/or 104 by means of thermal oxidation.

As shown in FIG. 6, in S220, the first semiconductor layer 101 is etched to form at least one first trench 105 and at least one second trench 107, the first trench 105 and the second trench 107 are downward from an upper surface of the first semiconductor layer, a depth of the first trench 105 is less than a thickness of the first semiconductor layer 101, that is, the first trench 105 does not exceed the intermediate insulating layer 120, the second trench 107 penetrates through the first semiconductor layer 101 and the intermediate insulating layer 120, but the second trench does not penetrate through the second semiconductor layer 102. Similarly, in S230, the second semiconductor layer 102 is etched to form at least one third trench 106 and at least one fourth trench 108, the third trench 106 and the fourth trench 108 are upward from a lower surface of the second semiconductor layer 102, a depth of the third trench 106 is less than a thickness of the second semiconductor layer 102, that is, the third trench 106 does not exceed the intermediate insulating layer 120, the fourth trench 108 penetrates through the second semiconductor layer 102 and the intermediate insulating layer 120, but the fourth trench 108 does not exceed the first semiconductor layer 101, and any two of the at least one first trench, the at least one second trench, the at least one third trench, and the at least one fourth trench are not communicated.

Optionally, if the upper surface of the first semiconductor layer 101 is provided with the first passivation insulating layer 103, the first trench 105 and the second trench 107 also penetrate through the first passivation insulating layer 103; and if the lower surface of the second semiconductor layer 102 is provided with the second passivation insulating layer 104, the third trench 106 and the fourth trench 108 also penetrate through the second passivation insulating layer 104.

For convenience of explanation, description is made mainly by an example of etching the first semiconductor layer 101 to form at least one first trench 105 and at least one second trench 107, while it is also applicable to a process of etching the second semiconductor layer 102 to form at least one third trench 106 and at least one fourth trench 108, which will not be repeatedly described here. Here, the order of etching the first semiconductor layer 101 and etching the second semiconductor layer 102 is not limited.

It should be understood that the number of the first trenches 105 and the second trenches 107 in the embodiment of the present disclosure may be one or more, and may be set according to actual disclosure, for example, an appropriate number of the first trenches 105 and the second trenches 107 may be set according to an area of a cross section of the first semiconductor layer 101, and the embodiment of the present disclosure is not limited thereto.

In addition, patterns presented by any cross section of the first trench 105 and the second trench 107 in the first semiconductor layer 101 may be arbitrary; when there are a plurality of first trenches 105 or a plurality of second trenches 107, patterns of the plurality of first trenches 105 or the plurality of second trenches 107 may be the same or different, and a pattern of any one of the first trenches 105 and a pattern of any one of the second trenches 107 may be the same or different, for example, as shown in FIG. 7, the plurality of first trenches 105 are all circular, one second trench 107 is rectangular, or may be any other regular or irregular patterns, and the embodiment of the present disclosure is not limited thereto.

Optionally, when there are a plurality of first trenches 105, they may be arranged in various ways, and positions of the first trenches 105 relative to the second trenches 107 may also be varied. For example, as shown in FIG. 7, the first trenches 105 are all circular holes arranged in a honeycomb, and are all located on one side of the second trench 107; for another example, the plurality of first trenches 105 may be arranged in other regular or irregular manners, and located on both sides of the second trench 107, and the embodiment of the present disclosure is not limited thereto.

In the embodiment of the present disclosure, the upper surface of the first semiconductor layer 101 or the upper surface of the first passivation insulating layer 103 is etched, for example, deep reactive ion etching (DRIE) that may include a ultra-low temperature type and a Bosch type may be used. Specifically, firstly, windows that are not covered with photoresist and have different opening sizes are partially formed on the surface of the first passivation insulating layer 103 by a photolithography process, that is, a first photoresist layer is spin-coated on the upper surface of the first passivation insulating layer 104, at least two first windows are partially opened on the first photoresist layer, the first passivation insulating layer and the first semiconductor layer are etched along the at least two first windows by means of deep reactive ion etching (DRIE), to form the at least one first trench 105 and the at least one second trench 107 in a direction perpendicular to the surface of the SOI substrate, and the photoresist layer is removed after the trenches are etched.

Specifically, since an etching rate is related to an opening size, a trench having a smaller opening has a smaller etching depth, while a trench having a larger opening has a larger etching depth; and therefore as for at least one first trench 105 whose depth does not reach the intermediate insulating layer 120 of the SOI substrate, its opening is smaller, thus its depth is smaller, on the contrary, at least one second trench 107 that penetrates through the intermediate insulating layer 120 of the SOI substrate, but does not penetrate through the entire SOI substrate, its opening is larger, and thus its depth is larger. It should be noted that both sides of the SOI substrate have one or more trench structures that penetrate through the intermediate insulating layer 120 of the SOI substrate, that is, at least one second trench 107 and at least one fourth trench 108, which cannot be connected to each other to form a through hole penetrating through the entire SOI substrate.

Optionally, the embodiment of the present disclosure does not limit a relative position of the first trench 105 and the second trench 107. For example, as shown in FIG. 7, the second trench 107 may be disposed to the right of all of the plurality of first trenches 105, or disposed at an intermediate position or other positions, or when there are a plurality of second trenches 107, positions of the plurality of second trenches 107 are not limited. In addition, as shown in FIG. 3, positions of trenches of the double-sided capacitor 100 may be asymmetrical and the number of trenches may be different, and the embodiment of the present disclosure is not limited thereto.

In the embodiment of the present disclosure, in view of processing efficiency, before the etching the first semiconductor layer 101 and the second semiconductor layer 102, the method 200 may further include: partially etching the first passivation insulating layer 103 and the second passivation insulating layer 104. Specifically, if the at least one first trench 105 has a large number and is arranged densely, for example, arranged in a honeycomb shown in FIG. 7, the first passivation insulating layer 103 and the second passivation insulating layer 104 may be partially etched first, and a photoresist layer may be sequentially spin-coated on surfaces of the upper first passivation insulating layers 103 and the lower second passivation insulating layer 104, and after exposure and development, windows uncovered with photoresist are partially opened; parts of the first passivation insulating layer 103 and the second passivation insulating layer 104 that are not covered with photoresist are removed by etching; and finally, the photoresist is removed to obtain the structure shown in FIG. 5, and furthermore the etching described in S220 and S230 is performed on the structure shown in FIG. 5. An opening region formed by the first passivation insulating layer in FIG. 5 corresponds to a first trench region.

In S240, an insulating material is deposited above the first semiconductor layer, on an inner surface of the at least one first trench and on an inner surface of the at least one second trench, and the insulating material at a bottom of the at least one second trench is removed to expose the second semiconductor layer, so that a remaining portion of the insulating material forms a first insulating layer 109.

In S250, an insulating material is deposited below the second semiconductor layer, on an inner surface of the at least one third trench, and on an inner surface of the at least one fourth trench; and the insulating material at a bottom of the at least one fourth trench is removed to expose the first semiconductor layer, so that a remaining portion of the insulating material forms a second insulating layer 110.

Figure 8:
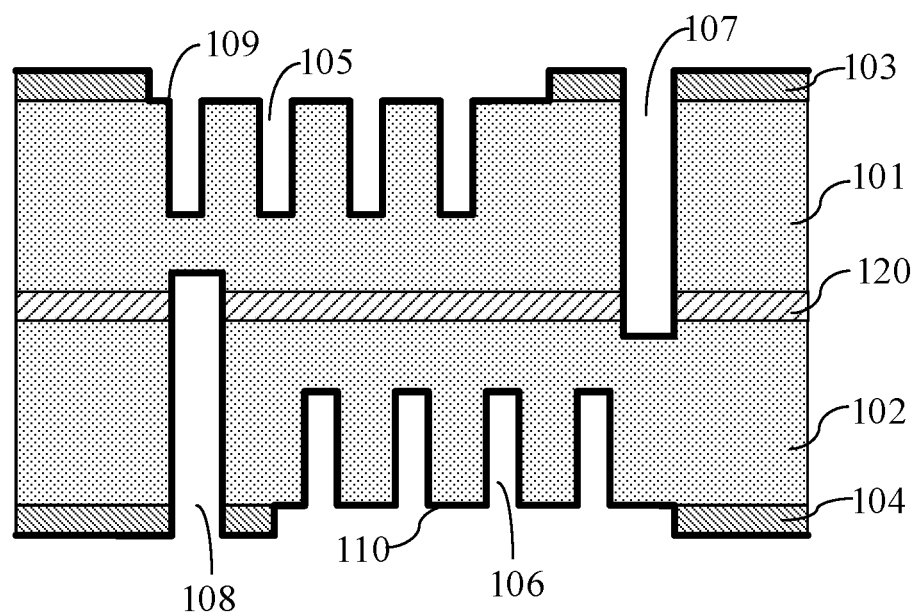
FIG. 8 is another schematic diagram of a process for fabricating a double-sided capacitor according to an embodiment of the present disclosure.

Specifically, FIG. 8 shows a schematic structural diagram after an insulating material is formed on both sides of a semiconductor, and at this time, the insulating material at a bottom of a second trench 107 and a fourth trench 108 has not been removed. Specifically, if an upper surface of a first semiconductor layer 101 includes a first passivation insulating layer 103, an insulating material is deposited on the upper surface of the first passivation insulating layer 103 to form a first insulating layer 109; and similarly, if an upper surface of a second semiconductor layer 102 includes a second passivation insulating layer 104, an insulating material is deposited on an upper surface of the second passivation insulating layer 104 to form a second insulating layer 110.

Next, description will be mainly made by an example of depositing an insulating material on a first semiconductor layer 101 and removing part of insulating material to form a first insulating layer 109, and it is also applicable to a process of depositing an insulating material on a second semiconductor layer 102 and removing part of insulating material to form a second insulating layer 110, and the order of processing the first semiconductor layer 101 and the second semiconductor layer 102 is not limited; for example, the first semiconductor layer 101 and the second semiconductor layer 102 may be sequentially processed or may be processed at the same time, which will not be repeatedly described here.

In an embodiment of the present disclosure, as shown in FIG. 8, first, an insulating material is deposited in a first trench 105, a second trench 107 and above a first semiconductor layer 101, or when a first passivation insulating layer 103 is disposed above the first semiconductor layer 101, an insulating material is deposited on an upper surface of the first passivation insulating layer 103, and the deposited insulating material is a first insulating layer 109.

It should be understood that there may be various manners of depositing the insulating material in the first trench 105, in the second trench 107, and above the first semiconductor layer 101, for example, the following manners may be included. For example, a silicon dioxide layer is grown as the first insulating layer 109 by means of thermal oxidation, or by means of atomic layer deposition (ALD), PVD, CVD, spin-coating, or the like. Correspondingly, a material of the first insulating layer 109 may include a silicon oxide, a silicon nitride, a metal oxide, a metal nitride, or the like, such as silicon dioxide, silicon nitride, aluminum oxide, aluminum nitride, hafnium oxide, zirconium oxide, zinc oxide, titanium dioxide, lead zirconate titanate, or the like. The first insulating layer 109 may be one layer, two or more layers, and a material of each layer may be the same or different. A specific material and a thickness of the layer may be adjusted according to a capacitance, frequency characteristic, loss and other requirements of the capacitor, and the embodiment of the present disclosure is not limited thereto.

ALD is a mature developed technology in recent years to deposit substances on a surface of an object layer by layer in the form of a monoatomic layer. ALD has advantages of excellent step coverage, film thickness uniformity, film continuity and material quality. Moreover, ALD may already realize the deposition of a high-k insulating dielectric material such as alumina, hafnium oxide and zirconia.

Alternatively, the material of the first passivation insulating layer 103 may be the same as or different from that of the first insulating layer 109.

In the embodiment of the present disclosure, after the insulating material is deposited on the inner surface of the second trench 107 having a depth exceeding the intermediate insulating layer 120, the insulating material at the bottom of the second trench 107 needs to be removed so that the insulating material is broken at the bottom of the second trench 107, and the second semiconductor layer 102 is exposed through the bottom. Correspondingly, the insulating material at the bottom of the fourth trench 108 is removed so that the insulating material is broken at the bottom of the fourth trench 108, and the first semiconductor layer 101 is exposed through the bottom. If a plurality of second trenches 107 are included, the insulating material at the bottom of each second trench 107 needs to be removed correspondingly; and similarly, if plurality of fourth trenches 108 are included, the insulating material at the bottom of each fourth trench 108 needs to be removed correspondingly.

Figure 9:
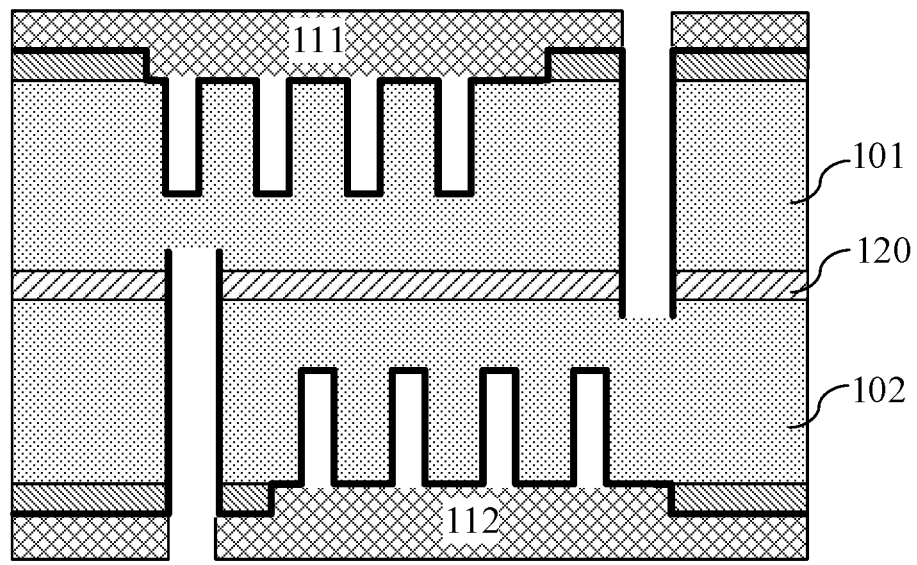
FIG. 9 is yet another schematic diagram of a process for fabricating a double-sided capacitor according to an embodiment of the present disclosure.

Specifically, the insulating material at the bottom may be removed in various manners. For example, as shown in FIG. 9, first a layer of a dry film is attached to a surface of an SOI substrate, such as a dry film 111 attached to an upper surface of a first passivation insulating layer 103 and a dry film 112 attached to an upper surface of a second passivation insulating layer 104 in FIG. 9, then a window is opened at each of a plurality of second trenches 107 with larger openings by photolithography, and finally the insulating material at a bottom of each of the second trenches 107 is removed by plasma etching, and similarly, the insulating material at a bottom of each of fourth trenches 108 is removed. The dry films 111 and 112 are removed after the insulating material at the bottom is removed.

In S260, a conductive material is deposited above the first semiconductor layer, in the at least one first trench and in the at least one second trench where the insulating material is deposited, to form a first electrode layer; as shown in FIGS. 1 to 3, the first electrode layer 113 is electrically isolated from the first semiconductor layer 101 through the first insulating layer 109 and is electrically connected to the second semiconductor layer 102 through the bottom of the at least one second trench 107. In S270, a conductive material is deposited below the second semiconductor layer, in the at least one third trench and in the at least one fourth trench where the insulating material is deposited, to form a second electrode layer; as shown in FIGS. 1 to 3, the second electrode layer 114 is electrically isolated from the second semiconductor layer 102 through the second insulating layer 110 and is electrically connected to the first semiconductor layer 101 through the bottom of the at least one fourth trench 108.

It should be understood that there are many manners of depositing the conductive material in the embodiment of the present disclosure, for example, the following manners may be selected, for example, ALD, PVD, metal-organic chemical vapor deposition, vapor deposition, electroplating, or the like. Correspondingly, the conductive material may be heavily doped polysilicon, or various metals such as aluminum, tungsten, copper, and the like, may also be a carbon-based material, or a low-resistivity compound such as titanium nitride, or a combination of the foregoing conductive materials, and the embodiment of the present disclosure is not limited thereto.

In the embodiment of the present disclosure, the processing order of the upper and lower capacitors of the SOI substrate is not limited, for example, the capacitors may be synchronously fabricated on both sides of the SOI substrate; alternatively, first a front side of the SOI wafer may be processed to fabricate an upper capacitor and a conductive channel, then a back side of the SOI wafer is processed to fabricate a lower capacitor and a back conductive channel, and the double-sided capacitor structure proposed by the present disclosure may also be realized by the way of first processing the front side and then the back side.

For ease of understanding, a method for fabricating a double-sided capacitor 100 according to an embodiment of the present disclosure will be described in detail below with reference to a specific example.

Step 1: an SOI substrate is selected, an upper layer of the SOI substrate is a first semiconductor layer 101, which is heavily doped monocrystalline silicon with a thickness of 200 microns (with resistivity of 1 mΩ•cm), an intermediate layer thereof is an intermediate insulating layer 120, which is silicon dioxide with a thickness of 100 nanometers, and a lower layer thereof is a second semiconductor layer 102, which is heavily doped monocrystalline silicon with a thickness of 200 microns (with resistivity of 1 mΩ•cm). The SOI wafer is placed in a high temperature furnace tube, in which a mixed gas of hydrogen and oxygen is introduced, and oxidized at a high temperature of 1150° C. for 2 hours. Silicon dioxide with a thickness about 1 micron is grown on the surface of the wafer, namely the first passivation insulating layer 103 and the second passivation insulating layer 104; then a photoresist layer is sequentially spin-coated on surfaces of the upper and lower layers of silicon dioxide, and after exposure and development, a window not covered with photoresist is partially opened; then the wafer is etched in a BOE solution with a ratio of 1:5 HF (49%):NH4F (40%) for 15 minutes to remove silicon dioxide uncovered with photoresist. Finally, the photoresist is removed to obtain the structure shown in FIG. 5.

Step 2, a layer of photoresist is spin-coated on an upper surface of the SOI wafer, and after exposure and development, windows of a circular hole array with diameters of 5 microns and a rectangular window with a length of 30 microns and a width of 10 microns are respectively opened, and the arrangement of the two windows is shown in FIG. 7. Then, a deep hole array and a trench are etched on the upper silicon by a DRIE process, and the deep hole array is an array formed by the first trenches 105 and the trench is the second trench 107, as shown in FIG. 6. A depth of the first trench 105 is 70 microns and a depth of the second trench 107 is 205 microns. The wafer is turned over and the foregoing operations are repeated. A deep hole array with a depth of 70 microns and a trench with a depth of 205 microns, which are a third trench and a fourth trench respectively are etched on the lower silicon of the SOI wafer. Finally, the photoresist is removed to obtain the structure shown in FIG. 6.

Step 3, using an ALD technology, 33 nm of hafnium oxide is deposited on surfaces of the first passivation insulating layer 103, the first trench 105 and the second trench 107 on the upper layer of the wafer as the first insulating layer 109, and 33 nm of hafnium oxide is deposited on surfaces of the second passivation insulating layer 104, the third trench 106 and the fourth trench 108 on the lower layer of the wafer as the second insulating layer 110, as shown in FIG. 8.

Step 4, dry films 111 and 112 are covered on the upper and lower surfaces of the SOI wafer. After exposure and development, windows are opened at the second trench 107 and the fourth trench 108. The hafnium oxide at the bottom of trenches 107 and 108 is removed by means of plasma etching, as shown in FIG. 9. Finally, the dry films 111 and 112 are removed.

Step 5: after Step 4, a layer of titanium and a layer of copper are first deposited in the first trench 105, the third trench 106, the second trench 107 and the fourth trench 108 by means of PVD, as a barrier layer and a seed layer for electroplating. Then, all deep holes and trenches are filled with copper by means of double-sided electroplating. Finally, a conductive material at the corners is removed by means of photolithography to form upper and lower electrodes of the capacitor, that is, the first electrode layer 113 and the second electrode layer 114, as shown in FIG. 2.

Therefore, according to a double-sided capacitor and a method for fabricating the same of an embodiment of the present disclosure, a trench structure having a depth not reaching an intermediate insulating layer and a trench structure having a depth exceeding the intermediate insulating layer are etched on both sides of an SOI substrate; an insulating dielectric film and a conductive material are sequentially deposited on a surface of the trench having the depth not reaching the intermediate insulating layer to form a capacitor; after an insulating dielectric film is deposited on a surface of the trench having the depth exceeding the intermediate insulating layer and the dielectric material at the bottom is removed, a conductive material is filled in the trench structure having the depth exceeding the intermediate insulating layer to become a conductive channel. At least one channel is insulated from an upper layer of the SOI substrate and is electrically connected to a lower layer of the SOI substrate; and at least one channel is insulated from the lower layer of the SOI substrate and is electrically connected to the upper layer of the SOI substrate.

Figure 10:
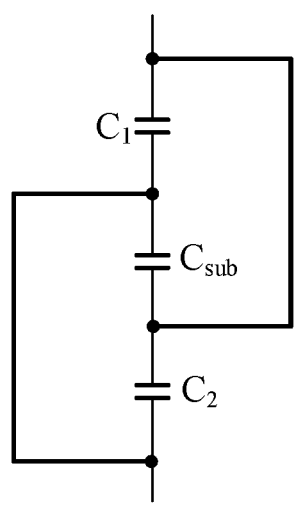
FIG. 10 is an equivalent circuit diagram of a double-sided capacitor according to an embodiment of the present disclosure.

In this way, front and back sides of the SOI wafer are respectively provided with a 3D capacitor fabricated based on a semiconductor process: an upper capacitor $C_1$ and a lower capacitor $C_2$; the SOI wafer itself has a substrate capacitor ($C_{sub}$); and the three capacitors are connected in parallel as shown in FIG. 10 through a conductive channel penetrating through the intermediate insulating layer of the SOI substrate, which is referred to as a large capacitor. Not only could etching a trench penetrating through the substrate be avoided so that an entire structure has stronger mechanical strength, but also a capacitance is larger utilizing a substrate capacitance of an SOI wafer itself.

It should be understood that in the embodiments of the present disclosure, "B corresponding to A" indicates that B is associated with A, and B may be determined based on A. However, it should further be understood that determining B based on A does not mean that B is determined based on A only; and B may also be determined based on A and/or other information.

In addition, the term "and/or" herein describes only an association relationship for describing associated objects and represents that three relationships may exist. For example, A and/or B may represent the following three cases: only A exists, both A and B exist, and only B exists. In addition, the character "/" in this specification generally indicates an "or" relationship between the associated objects.

It should be understood that sequence numbers of the foregoing processes do not mean execution sequences in various embodiments of the present disclosure. The execution sequences of the processes should be determined according to functions and internal logic of the processes, and should not be construed as any limitation on the implementation processes of the embodiments of the present disclosure.

Persons of ordinary skill in the art may realize that preferred embodiments of the present disclosure have been described in detail above with reference to the accompanying drawings, however, the present disclosure is not limited to the specific details in the foregoing embodiments. Persons skilled in the art may make various simple modifications to the technical solution of the present disclosure within the scope of the technical concept of the present disclosure, and these simple modifications all fall within the scope of protection of the present disclosure.

The foregoing descriptions are merely specific embodiments of the present disclosure, but the protection scope of the present disclosure is not limited thereto, persons skilled in the art who are familiar with the art could readily think of variations or substitutions within the technical scope disclosed by the present disclosure, and these variations or substitutions shall fall within the protection scope of the present disclosure. Therefore, the protection scope of the present disclosure shall be subject to the protection scope of the claims.

What is claimed is:

1. A double-sided capacitor, comprising:
   an intermediate insulating layer disposed between a first semiconductor layer and a second semiconductor layer;
   the first semiconductor layer provided with a first trench and a second trench, wherein the first trench and the second trench are downward from an upper surface of the first semiconductor layer, a depth of the first trench is less than a thickness of the first semiconductor layer, and the second trench penetrates through the first semiconductor layer and the intermediate insulating layer;
   the second semiconductor layer provided with a third trench and a fourth trench, wherein the third trench and the fourth trench are upward from a lower surface of the second semiconductor layer, a depth of the third trench is less than a thickness of the second semiconductor layer, the fourth trench penetrates through the second semiconductor layer and the intermediate insulating layer, and any two of the first trench, the second trench, the third trench, and the fourth trench are not communicated;
   a first electrode layer disposed above the first semiconductor layer, in the first trench, and in the second trench;
   a first insulating layer disposed between the first electrode layer and the first semiconductor layer to isolate the first electrode layer in the first trench from the first semiconductor layer, and broken at a bottom of the second trench to electrically connect the first electrode layer to the second semiconductor layer;
   a second electrode layer disposed below the second semiconductor layer, in the third trench, and in the fourth trench; and
   a second insulating layer disposed between the second electrode layer and the second semiconductor layer to isolate the second electrode layer in the third trench from the second semiconductor layer, and broken at a bottom of the fourth trench to electrically connect the second electrode layer to the first semiconductor layer.

2. The capacitor according to claim 1, wherein a width of any cross section of the first trench in the first semiconductor layer is less than a width of any cross section of the second trench; and/or
a width of any cross section of the third trench in the second semiconductor layer is less than a width of any cross section of the fourth trench.

3. The capacitor according to claim 2, wherein the capacitor further comprises:
a first passivation insulating layer disposed between the first semiconductor layer and the first insulating layer, the first trench and the second trench penetrating through the first passivation insulating layer; and/or
a second passivation insulating layer disposed between the second semiconductor layer and the second insulating layer, the third trench and the fourth trench penetrating through the second passivation insulating layer.

4. The capacitor according to claim 3, wherein materials of the first passivation insulating layer and/or the second passivation insulating layer are at least one of a silicon oxide, a silicon nitride and a polymer.

5. The capacitor according to claim 1, wherein the capacitor further comprises:
a first passivation insulating layer disposed between the first semiconductor layer and the first insulating layer, the first trench and the second trench penetrating through the first passivation insulating layer; and/or
a second passivation insulating layer disposed between the second semiconductor layer and the second insulating layer, the third trench and the fourth trench penetrating through the second passivation insulating layer.

6. The capacitor according to claim 1, wherein a shape of a cross section of the first trench is different from a shape of a cross section of the second trench, and/or
a shape of a cross section of the third trench is different from a shape of a cross section of the fourth trench.

7. The capacitor according to claim 1, wherein the first insulating layer and/or the second insulating layer comprise at least one of a silicon oxide layer, a silicon nitride layer, a metal oxide layer, and a metal nitride layer.

8. The capacitor according to claim 1, wherein the first electrode layer and/or the second electrode layer comprise at least one layer of heavily doped polysilicon, a carbon-based material, metal and titanium nitride.

9. A method for fabricating a double-sided capacitor, comprising:
providing a silicon-on-insulator (SOI) substrate, wherein the SOI substrate comprises a first semiconductor layer, an intermediate insulating layer and a second semiconductor layer from top to bottom;
etching the first semiconductor layer to form a first trench and a second trench, wherein the first trench and the second trench are downward from an upper surface of the first semiconductor layer, a depth of the first trench is less than a thickness of the first semiconductor layer, and the second trench penetrates through the first semiconductor layer and the intermediate insulating layer;
etching the second semiconductor layer to form a third trench and a fourth trench, wherein the third trench and the fourth trench are upward from a lower surface of the second semiconductor layer, a depth of the third trench is less than a thickness of the second semiconductor layer, the fourth trench penetrates through the second semiconductor layer and the intermediate insulating layer, and any two of the first trench, the second trench, the third trench and the fourth trench are not communicated;
depositing an insulating material above the first semiconductor layer, on an inner surface of the first trench and on an inner surface of the second trench, and removing the insulating material at a bottom of the second trench such that the insulating material is broken at the bottom of the second trench to expose the second semiconductor layer;
depositing an insulating material below the second semiconductor layer, on an inner surface of the third trench and on an inner surface of the fourth trench, and removing the insulating material at a bottom of the fourth trench such that the insulating material is broken at the bottom of the fourth trench to expose the first semiconductor layer;
depositing a conductive material above the first semiconductor layer, in the first trench and in the second trench where the insulating material is deposited, to form a first electrode layer; and
depositing a conductive material below the second semiconductor layer, in the third trench and in the fourth trench where the insulating material is deposited, to form a second electrode layer.

10. The method according to claim 9, wherein the etching the first semiconductor layer of the SOI substrate to form the first trench and the second trench comprises:
growing a first passivation insulating layer on the upper surface of the first semiconductor layer,
etching the first passivation insulating layer and the first semiconductor layer to form the first trench and the second trench, wherein the first trench and the second trench penetrate through the first passivation insulating layer; and/or
the etching the second semiconductor layer to form the third trench and the fourth trench comprises:
growing a second passivation insulating layer on the lower surface of the second semiconductor layer, and
etching the second passivation insulating layer and the second semiconductor layer to form the third trench and the fourth trench, wherein the third trench and the fourth trench penetrate through the second passivation insulating layer.

11. The method according to claim 10, wherein the etching the first passivation insulating layer and the first semiconductor layer comprises:
spin-coating a first photoresist layer on an upper surface of the first passivation insulating layer,
partially opening at least two first windows on the first photoresist layer,
etching the first passivation insulating layer and the first semiconductor layer along the at least two first windows to form the first trench and the second trench,
removing the first photoresist layer after the etching; and/or
the growing the second passivation insulating layer on the lower surface of the second semiconductor layer comprises:
spin-coating a second photoresist layer on an upper surface of the second passivation insulating layer,
partially opening at least two second windows on the second photoresist layer, etching the second passivation insulating layer and the second semiconductor layer along the at least two second windows to form the third trench and the fourth trench, and removing the second photoresist layer after the etching.

12. The method according to claim 10, wherein the growing the first passivation insulating layer and/or the second passivation insulating layer comprises:

growing a silicon dioxide layer by thermal oxidation, wherein the first passivation insulating layer and/or the second passivation insulating layer comprise the silicon dioxide layer; and/or growing a silicon nitride layer or a silicon oxide layer by physical vapor deposition and/or chemical vapor deposition, wherein the first passivation insulating layer and/or the second passivation insulating layer comprise the silicon nitride layer and/or the silicon oxide layer; and/or spraying and/or spin-coating a polymer layer or a spin on glass layer, wherein the first passivation insulating layer and/or the second passivation insulating layer comprise the polymer layer or the spin on glass layer.

13. The method according to claim 9, wherein the etching is deep reactive ion etching.

14. The method according to claim 9, wherein the depositing the insulating material comprises:

growing silicon dioxide by thermal oxidation, wherein the insulating material comprises the silicon dioxide; and/or depositing the insulating material by at least one of physical vapor deposition, chemical vapor deposition, atomic layer deposition, spraying and spin-coating.

15. The method according to claim 14, wherein the depositing the conductive material comprises:

depositing the conductive material by at least one of atomic layer deposition, physical vapor deposition, metal-organic chemical vapor deposition, vapor deposition, and electroplating.

* * * * *